United States Patent [19]
Takasu et al.

[11] Patent Number: 5,633,176
[45] Date of Patent: May 27, 1997

[54] METHOD OF PRODUCING A SEMICONDUCTOR DEVICE FOR A LIGHT VALVE

[75] Inventors: Hiroaki Takasu; Yoshikazu Kojima; Kunihiro Takahashi; Tsuneo Yamazaki; Tadao Iwaki, all of Tokyo, Japan

[73] Assignee: Seiko Instruments Inc., Japan

[21] Appl. No.: 463,687

[22] Filed: Jun. 5, 1995

Related U.S. Application Data

[62] Division of Ser. No. 308,564, Sep. 19, 1994, which is a division of Ser. No. 106,418, Aug. 13, 1993, Pat. No. 5,434,433.

[30] Foreign Application Priority Data

Aug. 19, 1992 [JP] Japan ................. 4-220504

[51] Int. Cl.$^6$ ............ H01L 21/84; H01L 21/304
[52] U.S. Cl. ............ 438/23; 438/42; 438/977; 438/692; 438/459
[58] Field of Search ............ 437/21, 40 TFT, 437/40 TFI, 41 TFT, 41 TFI, 974, 2; 148/DIG. 12, DIG. 135; 156/628.1, 636.1, 645.1

[56] References Cited

U.S. PATENT DOCUMENTS

| | | | |
|---|---|---|---|
| 4,024,626 | 5/1977 | Leupp et al. | 29/571 |
| 4,038,580 | 7/1977 | Porret | 257/88 X |
| 4,039,890 | 8/1977 | Bailey et al. | 257/88 X |
| 4,609,930 | 9/1986 | Yamazaki | 357/23.7 |
| 4,748,485 | 5/1988 | Vasudev | 357/23.7 |
| 4,751,196 | 6/1988 | Pennell et al. | 437/84 |
| 4,754,314 | 6/1988 | Scott et al. | 257/351 X |
| 4,875,086 | 10/1989 | Malhi et al. | 357/54 |
| 5,072,277 | 12/1991 | Sakakibara et al. | 257/351 |
| 5,110,748 | 5/1992 | Sarma | 437/974 |
| 5,212,397 | 5/1993 | See et al. | 257/350 X |
| 5,317,236 | 5/1994 | Zavracky et al. | 437/974 |

FOREIGN PATENT DOCUMENTS

| | | |
|---|---|---|
| 0136509 | 4/1985 | European Pat. Off. |
| 0164646 | 12/1985 | European Pat. Off. |
| 0211402 | 2/1987 | European Pat. Off. |
| 0268380 | 5/1988 | European Pat. Off. |
| 0342925 | 11/1989 | European Pat. Off. |
| 2715446 | 10/1978 | Germany |
| 134283 | 2/1979 | Germany |
| 57-167655 | 10/1982 | Japan |
| 59-126639 | 7/1984 | Japan |

(List continued on next page.)

OTHER PUBLICATIONS

Patent Abstracts of Japan, vol. 15, No. 287 (P-1229) 22 Jul. 1991, JP-A-3 100 516 (Sharp) 25 Apr. 1991.

Electronics Letters, vol. 25, No. 15, 20 Jul. 1989, pp. 1009–1011, R.P. Zingg et al., "High-Quality Dual-Gate PMOS Devices In Local Overgrowth (LOG)".

(List continued on next page.)

Primary Examiner—Charles L. Bowers, Jr.
Assistant Examiner—Leon Radomsky
Attorney, Agent, or Firm—Adams & Wilks

[57] ABSTRACT

A semiconductor substrate is utilized to integrally form a drive circuit and a pixel array to produce a transparent semiconductor device for a light valve comprising a pixel array region and a drive circuit region on a major face of the semiconductor substrate. A stopper film is formed on the major face of the semiconductor substrate at the pixel array region, and a pixel array is formed over the silicon oxide stopper film. A drive circuit is formed on the drive circuit region, and silicon oxide posts are embedded in the major face of the semiconductor substrate at the drive circuit region. A thickness of the semiconductor substrate is then selectively removed from a back face opposite to the major face thereof to reach the stopper film. After the selective removing step, the portion of the semiconductor substrate under the pixel region is completely removed while a portion of the semiconductor substrate under the drive circuit region remains.

10 Claims, 15 Drawing Sheets

FOREIGN PATENT DOCUMENTS

| | | |
|---|---|---|
| 60-143666 | 7/1985 | Japan . |
| 63-55529 | 3/1988 | Japan . |
| 63-90859 | 4/1988 | Japan . |
| 1-38727 | 2/1989 | Japan . |
| 1-194351 | 8/1989 | Japan . |
| 2-154232 | 6/1990 | Japan . |
| 4362616 | 12/1992 | Japan ................................. 359/59 |
| 2206445 | 1/1989 | United Kingdom . |

OTHER PUBLICATIONS

Patent Abstracts of Japan, vol. 8, No. 70 (E–235(1507) 3 Apr. 1984 JP–A–58 218169 (Suwa Seikosha) 19 Dec. 1983.

Fujitsu Scientific and Technical Journal, vol. 24, No. 4 & index, Dec. 1988, pp. 408–417.

Journal of the Electromechanical Society, vol. 120, No. 11, Nov. 1973, pp. 1563–1566.

Patent Abstracts of Japan, vol. 13, No. 572, (P–978) 18 Dec. 1989, JP–A–1 239 530 (Seiko Epson 25 Sep. 1989.

Patent Abstracts of Japan, vol. 10, No. 298 (P–505) 9 Oct. 1986, JP–A–61 114 225 (Matsushita) 31 May 1986.

IEEE Transactions on Electron Devices, vol. 37, No. 1, Jan. 1990, pp. 121–127.

Japanese Journal of Applied Physics, vol. 29, No. 4, part 2, Apr. 1990, pp. L521–L523.

Patent Abstracts of Japan, vol. 13, No. 228 (P–877) 26 May 1989, JP–A–1 038 727 (NEC) 9 Feb. 1989.

Patent Abstracts of Japan, vol. 13, No. 578 (E–864) 20 Dec. 1989, JP–A–1 241 862 (Sony) 26 Sep. 1989.

Patent Abstracts of Japan, vol. 10, No. 1 (E–371) 7 Jan. 1986, JP–A–60 167 364 (Matsushita) 30 Aug. 1985.

T. Hamaguchi, et al., Jpn. J. Appl. Phys., 23(10) (1984) L815, "Device Layer Transfer Technique usning Chemi–Mechanical Polishing" 1984.

S. Takahashi, et al., IEEE Conf. Proc. '90, p. 147, ". . . SOI Devices Obtained by the Device Transfer Method" 1990.

K. Sumiyoshi, et al., IEDM '89 Proc., p. 165, "Device Layer Transferred Poly Si TFT Array for HRLC Projector" 1989.

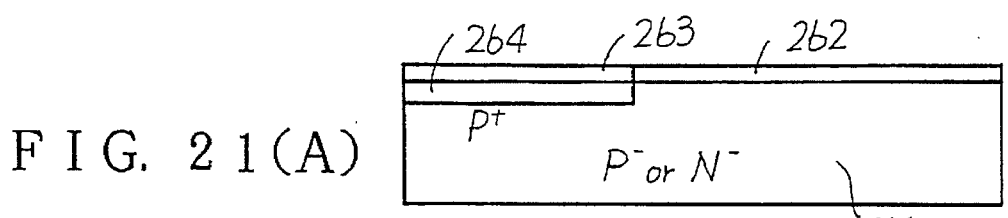
FIG. 21(A)
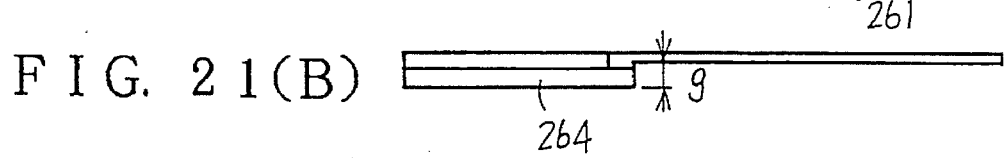
FIG. 21(B)
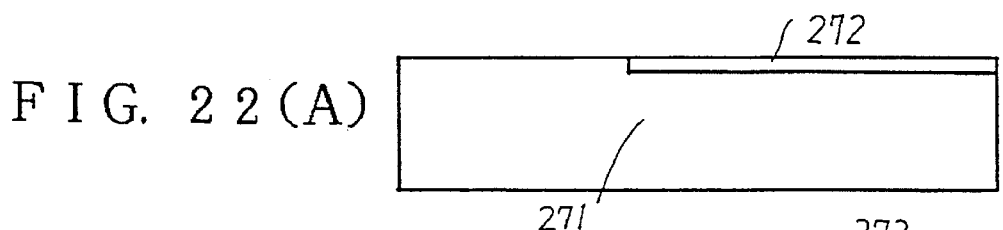
FIG. 22(A)
FIG. 22(B)
FIG. 22(C)
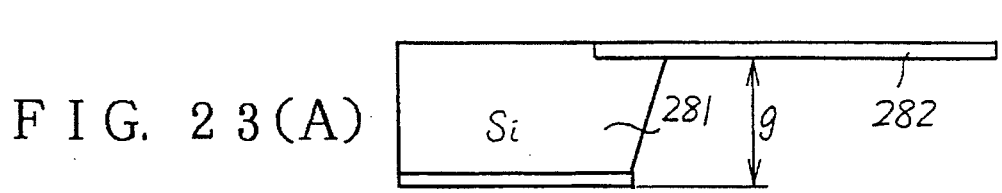
FIG. 23(A)
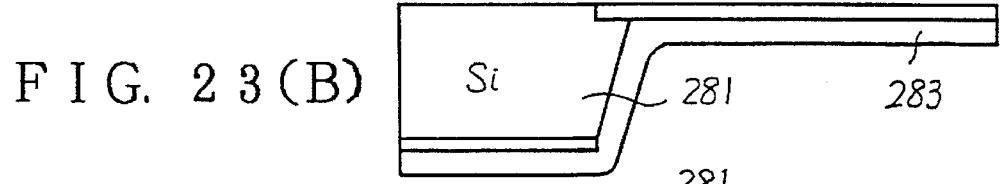
FIG. 23(B)
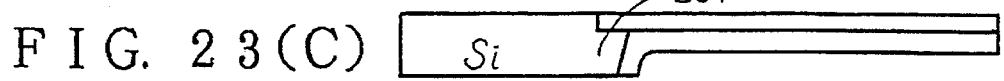
FIG. 23(C)
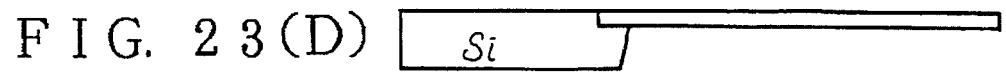
FIG. 23(D)

METHOD OF PRODUCING A SEMICONDUCTOR DEVICE FOR A LIGHT VALVE

This is a division, of application Ser. No. 08/308,564 filed Sep. 19, 1994 which is a division of Ser. No. 08/106,418 filed Aug. 13, 1993, now U.S. Pat. No. 5,434,433.

BACKGROUND OF THE INVENTION

The present invention relates to a semiconductor device for a light valve and a production method thereof. More specifically, the present invention relates to a transparent semiconductor device and a production method of the same which is utilized as a driving substrate of a flat light valve such as an active matrix liquid crystal display device.

FIG. 26 shows a general construction of the driving substrate used in the active matrix liquid crystal display device. The driving substrate 1001 is formed integrally thereon with a pixel array 1002 and a peripheral drive circuit including an X-drive 1003 and a Y-drive 1004 by an IC fabrication process.

FIG. 27 schematically shows the pixel array. A thin film transistor (TFT) 1007 is formed for switching a pixel at each intersection between plural scan lines 1005 and plural signal lines 1006. The TFT 1007 is connected at its gate electrode to corresponding scan line 1005, connected at its source electrode to a corresponding signal line, and connected at its drain electrode to a corresponding liquid crystal pixel 1008. The liquid crystal pixel 1008 is composed of a liquid crystal layer sandwiched between the driving substrate and a counter substrate. While the scan lines 1005 are scanned to select and open the TFTs 1007, the signal lines 1006 are accessed to write an image signal into the corresponding liquid crystal pixels 1008.

The TFT is composed of a semiconductor thin film material conventionally selected from polysilicon or amorphous silicon. However, these materials have a relatively low mobility, hence it would be difficult to utilize the TFT for a transistor element of the peripheral drive circuit. In view of this, recently another technology has been developed such that a single crystal silicon (monosilicon) transistor is formed to constitute a peripheral drive circuit element, as disclosed for example in Tokkaihei 3-100516. This prior art utilizes a composite substrate comprised of a monosilicon wafer laminated on another wafer composed of a transparent insulating material such as quartz glass. The monosilicon wafer is partly removed by etching so that a pixel array is formed on an exposed surface of the quartz glass wafer, while a peripheral drive circuit is formed in the remaining part of the monosilicon wafer.

However, when a high temperature IC process over 1000° C. is applied to the composite substrate comprised of a laminate of the quartz glass wafer and the monosilicon wafer, the substrate is deformed due to thermal expansion difference to thereby disadvantageously hinder a yield rate and reliability. In view of such a problem of the prior art, an object of the invention is to construct a semiconductor device for a light valve by using a stable substrate free of thermal deformation.

SUMMARY OF THE INVENTION

Referring to FIG. 1, description is given for means to solve the above noted problem of the prior art and to achieve the object of the invention. First, as shown in FIG. 1(B), the inventive semiconductor device for a light value is formed of a semiconductor substrate 3 having an opaque portion 1 having a certain thickness, and a transparent portion 2 free of said thickness. The semiconductor substrate in the opaque portion has a thickness thick enough to prevent light transmitting, e.g., over 10 μm in thickness. For example, the semiconductor substrate 3 is composed of a bulk monosilicon (single crystal silicon) wafer. A pixel array is formed in the transparent portion 2 along a major face 4 of the semiconductor substrate 3, while a drive substrate is formed in the opaque portion 1 along the same major face 4. Further, a transparent support substrate 5 composed of, for example, quartz glass is superposed on the major face 4 of the semiconductor substrate where the pixel array and the drive circuit are provided.

Preferably, the support substrate 5 is bonded to the semiconductor substrate 3 through a protective film 6 and an adhesive layer 7. The transparent support substrate 5 can be constituted by the adhesive layer 7 itself or both the adhesive layer 7 and a leveling layer, not shown in FIG. 1, which is interposed between the adhesive layer 7 and the protective layer 6.

A pre-complete form of the semiconductor device shown in FIG. 1(B) is illustrated in FIG. 1(A). As described before, the high temperature IC process is applied to the semiconductor substrate 3 composed of the bulk monosilicon wafer to form concurrently the drive substrate 8 and the pixel array 9. In this construction, the drive circuit 8 contains a single crystal transistor 10 formed directly in the major face 4 of the semiconductor substrate 3. The pixel array 9 contains a switching element in the form of a TFT 11 and a pixel electrode 12. This pixel array 9 is formed on an underlying insulative film 13 provisionally provided along the major face 4 of the semiconductor substrate 3. The pixel array 9 and the drive circuit 8 are interconnected to each other through a metal lead 14 on the same substrate.

FIG. 1(C) shows an active matrix liquid crystal display device constructed of the semiconductor device for a light valve in FIG. 1(B). The liquid crystal display device is constructed by using a cavity formed in the transparent portion of the semiconductor substrate 3. An orientation film 21 is formed on a back of the underlying insulative film 13 exposed in the transparent portion. Further, a transparent counter substrate 16 is laminated through a spacer 15 composed of a seal material. A common electrode 17 and an orientation film 18 are formed on an inner face of the counter substrate 16. A liquid crystal layer 19 is filled between the pair of orientation films 14,18. Though not shown in FIG. 1(B), a leveling layer 20 is preferably interposed between the protective film 6 and the adhesive layer 7. Further, a periphery of the transparent support substrate 5 is partly removed to expose an electrode terminal for external connection (pad electrode) 23.

Further referring to FIG. 1, the description is given for a production method of the inventive semiconductor device for a light valve. As shown in FIG. 1(A), the first step is carried out such that the pixel array 9 and the drive circuit 8 are formed on the major face 4 of the semiconductor substrate 3. Since the semiconductor substrate 3 is composed of, for example, a bulk monosilicon wafer, a high temperature IC process is directly applied in manner similar to a rectangular LSI fabrication technology. Further, the TFT 11 contained in the pixel array 9 and the single crystal transistor 10 contained in the drive circuit 8 can be fabricated by the same process. In this first step, the underlying insulative film 13 is provisionally formed under the pixel array 9, which will be served as an etching stopper in a later step. The underlying insulative film 13 is composed of, for example, a silicon oxide film, a silicon nitride film or a composite film thereof.

Next, as shown in FIG. 1(B), the second step is undertaken to bond the transparent support substrate 5 to the major face 4 of the semiconductor substrate 3 by means of the adhesive layer 7. The transparent support substrate 5 is composed of, for example, glass, quartz or sapphire, and preferably has a thermal expansion coefficient comparable to that of the semiconductor substrate 3. Further preferably, the leveling layer is interposed between the transparent adhesive layer 7 and the semiconductor substrate 3 to absorb unevenness of the major face. Although the transparent support substrate 5 is formed adhesively over the whole portion of the major face on which the drive circuit 8 is formed, as shown in FIG. 1(B), the transparent support substrate 5 can be bonded adhesively with slightly enlarging from the transparent portion 2 and slightly covering over the opaque portion 1 because the pixel array 9 in the transparent portion 2 has to keep its mechanical strength in the third step of making the pixel array transparent. Preferably, a length of overlapping the transparent support substrate 5 and the opaque portion 1 is larger than a thickness of both the opaque portion 1 and the semiconductor substrate 3. In this case, the semiconductor substrate 3 acts in reinforcing the substrate in the opaque portion 1. Subsequently, the third step is undertaken such that a thickness of the semiconductor substrate 3 is selectively removed over a region of the pixel array from a back face opposite to the major face 4, thereby making the pixel array transparent. The third step is carried out by etching, using a resist mask 22 and using the underlying insulative film 13 as the etching stopper as described before. The semiconductor device for a light valve is produced by such a manner. Further, as shown in FIG. 1(C), a liquid crystal cell can be assembled into the transparent portion from which the thickness or bulk of the semiconductor substrate is removed.

The present invention utilizes a bulk semiconductor substrate, and the drive circuit and the pixel array are integrally formed by the regular IC process. In contrast to the prior art which uses a composite substrate, the semiconductor substrate may not suffer from thermal deformation under high temperature processing, thereby producing the semiconductor device for a light valve featuring a compact size, high resolution and large capacity. The drive circuit is comprised of a single crystal transistor to thereby achieve faster and higher operation characteristics as compared to the prior art. Next, the semiconductor substrate formed with the drive circuit and the pixel array is reinforced by the transparent support substrate along the major face, while the thickness or bulk of the semiconductor substrate is etched away to make the substrate transparent. This etching process is applied to the back face of the substrate to avoid contamination and destruction of elements involved in the drive circuit and the pixel array to thereby ensure the device reliability. Further, the semiconductor substrate is reinforced by the transparent support substrate to thereby ensure mechanical strength while a window is opened for a display in the semiconductor substrate. Moreover, a liquid crystal cell or the like can be mounted compactly in the display window from which the thickness of the semiconductor bulk is removed. Furthermore, since a portion formed with the drive circuit has a thickness or bulk of the semiconductor substrate, heat generated by the drive circuit can be absorbed immediately, so that the drive circuit can operate stably while suppressing temperature increases. In this case, the thickness of the semiconductor substrate is preferably more than 100 μm.

BRIEF DESCRIPTION OF THE DRAWINGS

FIGS. 21(A) and 21(B) are step diagrams showing a fourth example of the etching process;

FIGS. 22(A) to 22(C) are step diagrams showing a fifth example of the etching process;

FIGS. 23(A) to 23(D) are step diagrams showing a sixth example of the etching process;

DETAILED DESCRIPTION OF THE PREFERRED EMBODIMENTS

Hereinafter, preferred embodiments of the invention will be described in detail with reference to the drawings.

Figure 1:
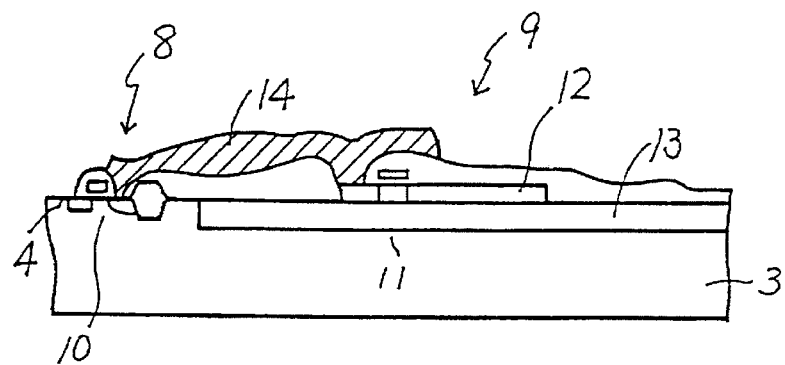
FIGS. 1(A) to 1(C) are schematic diagrams showing a basic concept of the inventive semiconductor device for a light valve and the production method thereof.
Figure 1:
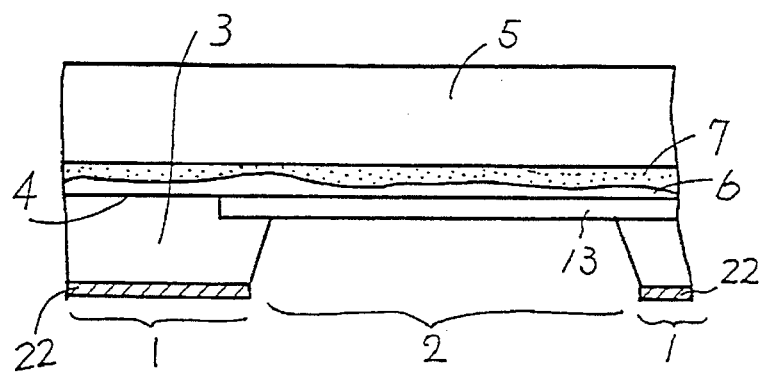
Figure 1:
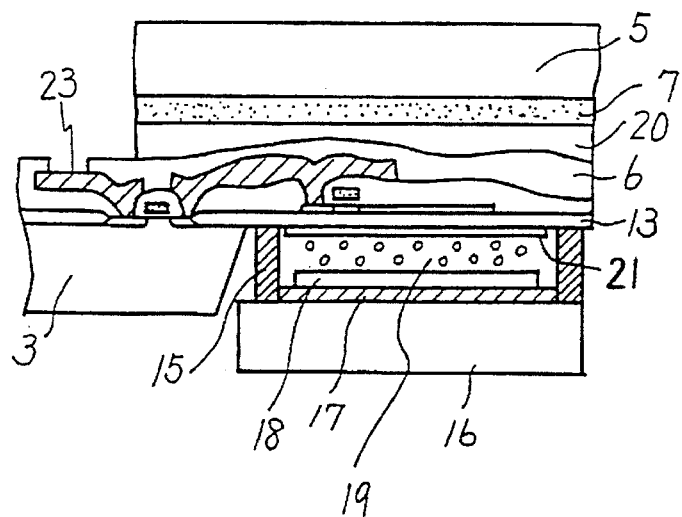
Figure 2:
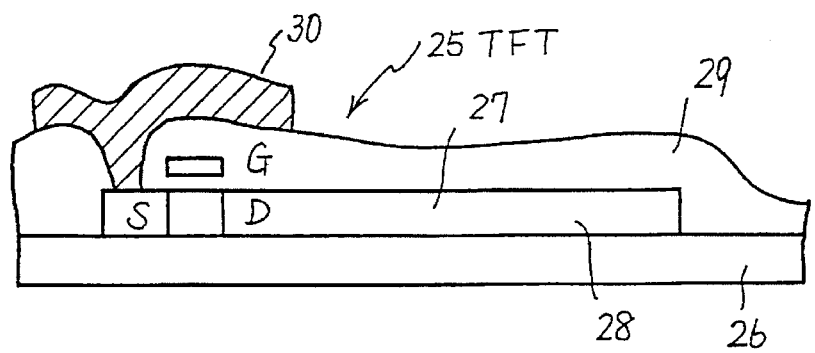
FIGS. 2(A) and 2(B) are schematic sectional diagrams showing an embodiment of a TFT which constitutes a pixel switching element.
Figure 2:
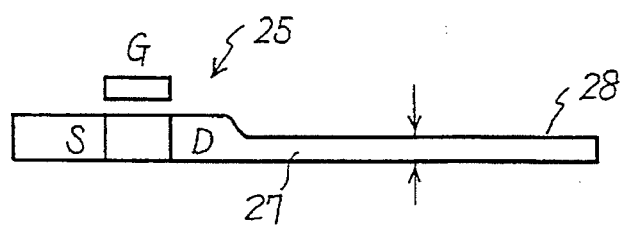

FIG. 2 is a schematic diagram showing one embodiment of a switching element involved in the pixel array. In this embodiment as shown in (A), the pixel switching element is comprised of a polysilicon TFT 25. Namely, a polysilicon thin film 27 is provided in a predetermined pattern on an underlying insulative film 26. A pair of source region S and drain region D are formed in one part of the polysilicon thin film 27 in the form of a high density impurity region. A gate electrode G is patterned on a channel region disposed between both of the regions S,D, and is disposed through a gate insulating film. Another part of the polysilicon thin film 27 is extended to form a pixel electrode 28. Preferably, a thickness of the pixel electrode is set in the range of 50 nm±10 nm effective to optimumly balance transmissive characteristics for three primary color (RGB) incident lights. Such a structure of the TFT 25 and the pixel electrode 28 is coated by an intermediate insulating film 29. Further, a metal lead 30 composed of aluminum or the like is connected to the TFT through a contact hole opened in the intermediate insulating film 29. A part of the metal lead 30 covers an active region of the TFT 25 to function as light shielding film. Though the TFT is composed of the polysilicon thin film in this embodiment, the invention is not limited to such a structure. Alternatively, an amorphous silicon thin film or single crystalline silicon thin film may be used in place of the polysilicon thin film. Further, the switching element may be comprised of a diode in place of the TFT.

FIG. 2(B) shows a variation of the TFT shown in FIG. 2(A). In this variation, a section of the pixel electrode 28 is exclusively thinned in the order of 50 nm to selectively achieve transparency in the patterned polysilicon thin film 27. On the other hand, the remaining section of the polysilicon thin film 27 has a sufficient thickness to provide an active region of the TFT 25 so as to improve the transistor performance.

Figure 3:
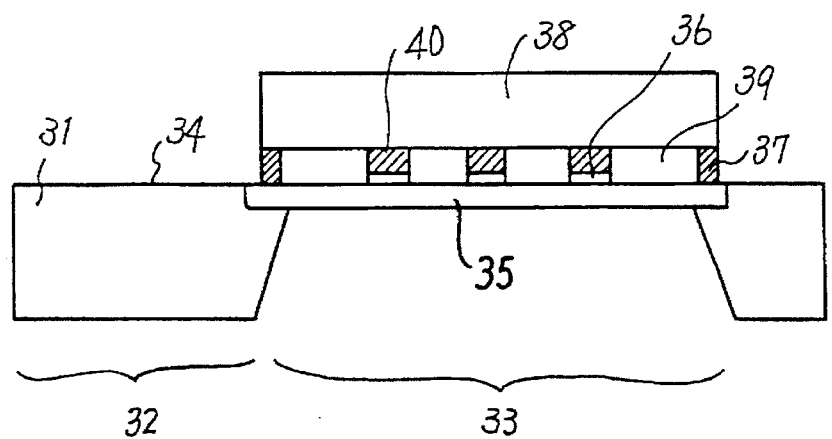
FIG. 3 is a schematic sectional diagram showing an embodiment where a liquid crystal cell is assembled into a top face of the inventive semiconductor device for a light valve.

FIG. 3 is a schematic sectional diagram showing one embodiment of the inventive semiconductor device for a light valve. A semiconductor substrate 31 is divided into an opaque portion 32 having a certain bulk thickness, and a transparent portion 33 from which the bulk thickness is removed. A drive circuit (not shown) is formed in a major face 34 of the semiconductor substrate 31 within the opaque portion 32. Preferably, the semiconductor substrate 31 in the opaque portion 32 has a thickness sufficient to prevent light transmittance, e.g., over 10 μm in thickness. Furthermore, the thickness over 100 μm of the semiconductor substrate 31 in the opaque portion 32 should be better to prevent temperature increase caused by heat generated in the drive circuit. On the other hand, a pixel array is formed on an underlying insulative film 35 within the transparent portion 33. The pixel array contains a switching element in the form of a TFT 36. Such a construction of the semiconductor substrate 31 is bonded to a transparent support substrate 38 by means of a sealer 37 for reinforcement. In this embodiment, the transparent support substrate 38 is placed in registration with the transparent portion 33 or display window portion to serve as a counter substrate. Namely, a liquid crystal layer 39 is filled between the underlying insulative film 35 and the counter substrate 38 to constitute a liquid crystal cell. Further, the underlying insulative film 35 is supported the filled liquid crystal layer 39 and a spacer 40. The spacer 40 is provided just over the TFT 36 to improve a pixel open rate. Though the liquid crystal cell is of an active matrix type in this embodiment, the invention is not limited to such a construction. Alternatively, a simple matrix structure may be adopted in place of the active matrix structure, which has only stripes of transparent pixel electrodes. Further, a transparent resin may be filled for reinforcement into the transparent portion 33 from which the bulk thickness is removed. Or a second transparent support substrate may be bonded adhesively for reinforcement onto the transparent portion 33.

Figure 4:
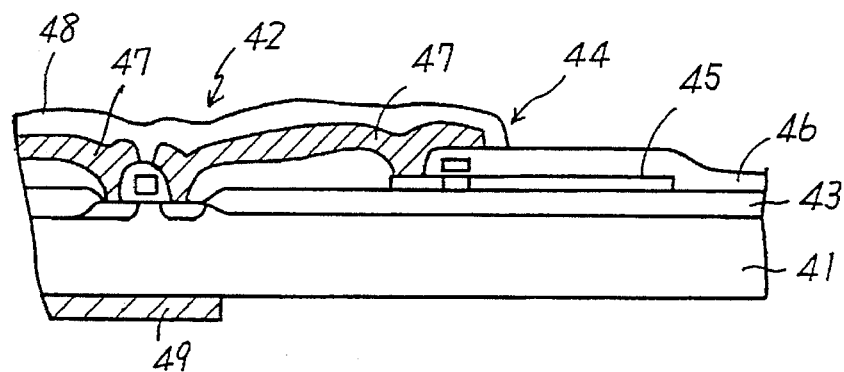
FIGS. 4(A) to 4(C) are production step diagrams of the FIG. 3 embodiment.
Figure 4:
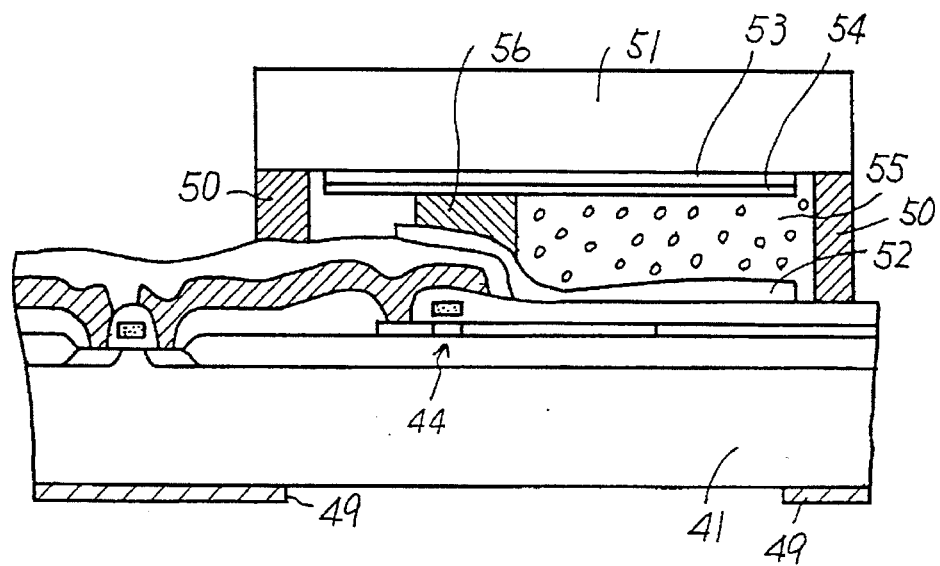
Figure 4:
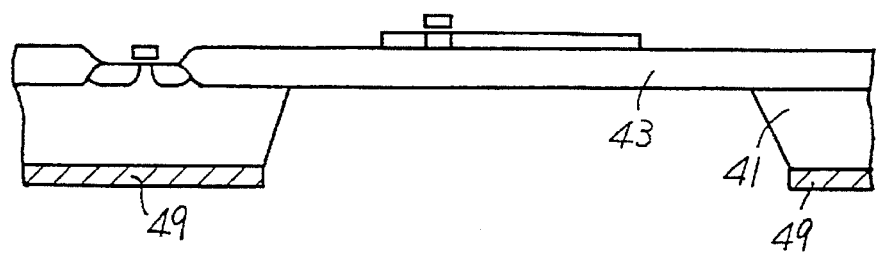

FIG. 4 is a step diagram showing a production method of the FIG. 3 device in which the liquid crystal cell is disposed on the top major face. FIG. 4 shows a case of using a polysilicon TFT as a switching element in the pixel array. First in a step (A), an IC process is applied to a top major face of a semiconductor substrate 41 to form a peripheral drive circuit and a pixel array. In this embodiment, the peripheral drive circuit contains a regular silicon single crystal transistor 42 which is directly and integrally formed in the major face of the semiconductor substrate 41 composed of a bulk single crystal silicon. On the other hand, the pixel array is formed on a transparent insulating film 40 which is obtained by surface LOCOS oxidation of the semiconductor substrate 41. This pixel array includes a polysilicon TFT 44 and a pixel electrode 45 which is formed in an extended part of a drain region of the TFT 44. The silicon transistor 42 and the polysilicon TFT 44 are coated by an intermediate insulating film 46 composed of PSG or the like. Lastly, a contact hole is opened through the intermediate insulating film 46, a metal lead 47 is formed, and then a protective film or passivation film 48 is coated. Subsequently, fabrication steps are switched to back face processing such that a portion where the peripheral drive circuit is provided is selectively covered by a film 49 composed of silicon nitride or the like having certain etching resistance. The film 49 is patterned by, for example, a two-face aligner.

Next in step (B), a transparent support substrate 51 is bonded to the top face of the semiconductor substrate 41 by means of a sealer 50. Prior to this step, an orientation film 52 made of polyimide or something else is formed on a surface of the pixel array. On the other hand, a counter electrode 53 and another orientation film 54 made of polyimide are provisionally formed on an inner surface of the transparent support substrate 51. After the semiconductor substrate 41 and the transparent support substrate 51 are laminated to each other, liquid crystal layer 55 is filled in a gap between both of the substrates. Further a support post or spacer 56 is provisionally provided on top of each TFT 44 by means of screen printing or other methods.

Lastly in step (C), the semiconductor substrate 41 is etched through the film 49 to remove the bulk thickness just under the pixel array to make the same transparent. This etching process utilizes an alkali etchant such as KOH solution. An end point of the etching process is automatically determined by the underlying insulative film 48 which functions as an etching stopper. By the way, components on the top face are eliminated from the view of figure (C).

Figure 5:
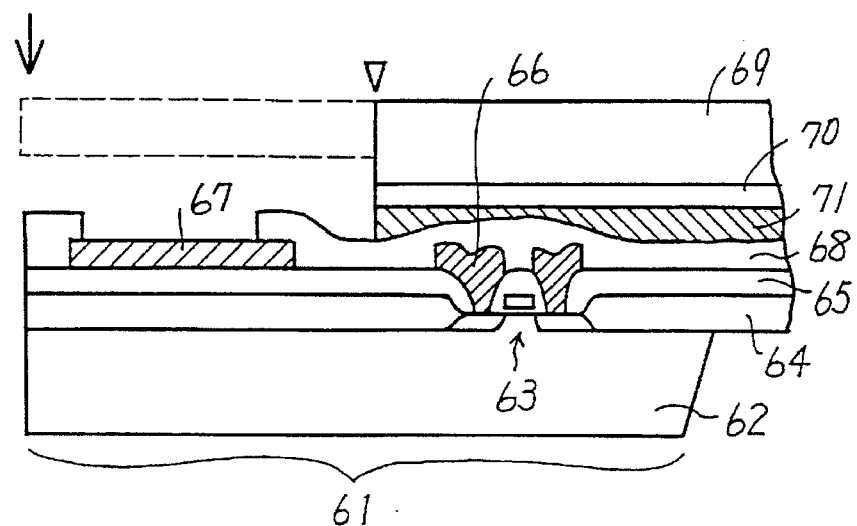
FIG. 5 is a schematic partial sectional diagram showing another embodiment of the inventive semiconductor device for a light valve.

FIG. 5 is a partial sectional diagram schematically showing an opaque portion 61 of another embodiment of the semiconductor device for a light valve according to the invention. A semiconductor substrate 62 is formed on the surface with a drive circuit comprised of a silicon transistor 63 of an insulating gate field effect type. Individual transistors 63 are separated from each other by a field oxide film 64. A metal lead 66 and a pad electrode 67 electrically connected thereto for external coupling are formed in a given pattern over an intermediate insulating film 65. Further, the drive circuit except for the pad electrode 67 is coated by a passivation film 68. A transparent support substrate 69 composed of glass or the like is bonded to the semiconductor substrate through an adhesive layer 70. Preferably, the adhesive layer 70 is composed of a silicon dioxide paste which will be cured by heating or ultraviolet ray irradiation. Further, a leveling layer 71 is interposed between the adhesive layer 70 and the passivation film 68. Preferably, the leveling layer 71 is also composed of silicon dioxide material effective to significantly absorb or compensate surface unevenness of the semiconductor substrate 62.

In this embodiment, the transparent support substrate 69 is removed partly over the pad electrode 67 to thereby facilitate external connection. In order to remove partly the transparent support substrate 69, after an individual semiconductor device for a light valve is cut out by a scriber at a line indicated by the arrow, a part of the transparent support substrate 69 is selectively separated along a line indicated by the inverted triangle mark. By the way, an end part of the transparent support substrate 69 to be cut away is provisionally formed with an undercut effective to avoid contact to the pad electrode 67. Although the transparent support substrate 69 is formed over the drive circuit as shown in FIG. 5, the transparent support substrate 69 may not be formed covering the drive circuit but covering only the opaque portion 61.

Figure 6:
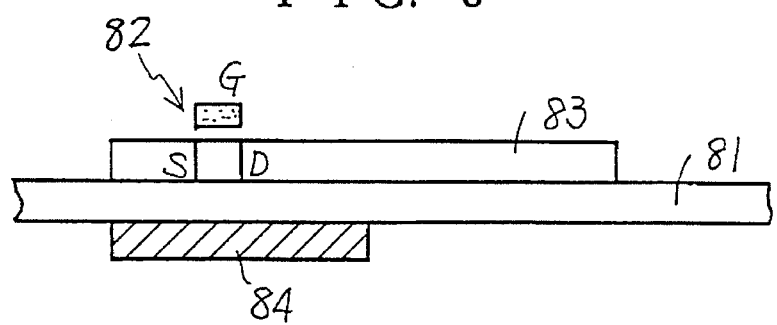
FIG. 6 is a schematic diagram showing a light shielding structure of a TFT which constitutes a pixel switching element.

Next, description will be given for various embodiments with regard to a light shielding structure of a TFT in conjunction with FIGS. 6–10. Generally, the TFT used for a pixel switching element has a tendency to increase a leak current upon irradiation with incident light. For this, it is expedient to add an adequate light shielding structure when utilizing the TFT in the semiconductor device for light valve. FIG. 6 shows a first example of the light shielding structure. A pixel switching element is provided in the form of a TFT 82 on an underlying insulative film 81. The TFT 82 is comprised of a source region S and a drain region D formed in a polysilicon thin film 83, and a gate electrode G formed over a gate insulating film. A light shielding film 84 is disposed on a back face of the underlying insulative film 81, and is patterned in registration with an active region of the TFT 82. The light shielding film 84 composed of a high melting point metal, a silicide or a silicon.

Figure 7:
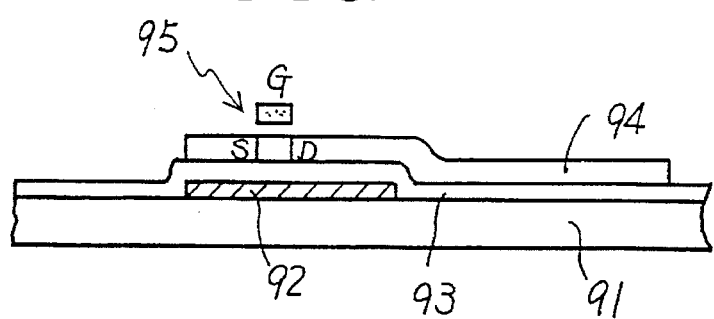
FIG. 7 is a schematic diagram showing another light shielding structure of a TFT.

FIG. 7 shows a second example of the light shielding structure. An electronically conductive light shielding film 92 is formed on a top face of an underlying insulative film 91 in a given pattern. A thin insulating film 93 is provided to cover the light shielding film 92. Further, a patterned polysilicon is formed over the film 93 to provide a TFT 95 for a pixel switching element in a manner similar to the previous example. In this example, the electrically conductive light shielding film 92 is disposed just under a channel region of the TFT 95 through the thin insulating film 93 to thereby function as a "back gate electrode".

Figure 8:
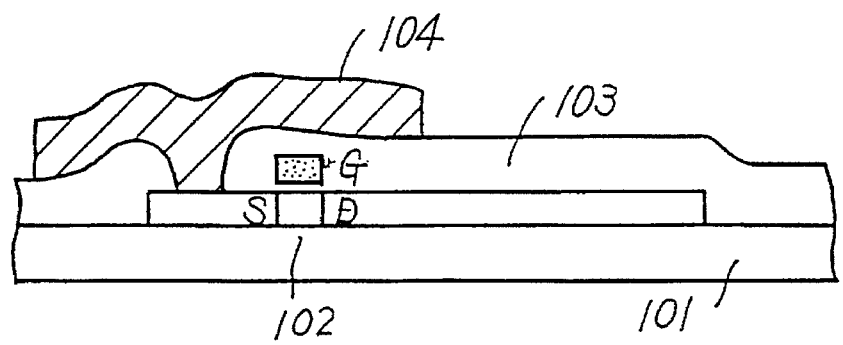
FIG. 8 is a schematic diagram showing a further light shielding structure of a TFT.

FIG. 8 shows a third example of the light shielding structure. A TFT 102 is formed on an underlying insulative film 101 in manner similar to the other examples. A patterned metal lead 104 is formed thereover through an intermediate insulating film 103, and is electrically connected to a source region of the TFT 102. A part of this metal lead 104 is extended to cover an active region of the TFT 102 to thereby function as a light shielding film.

Figure 9:
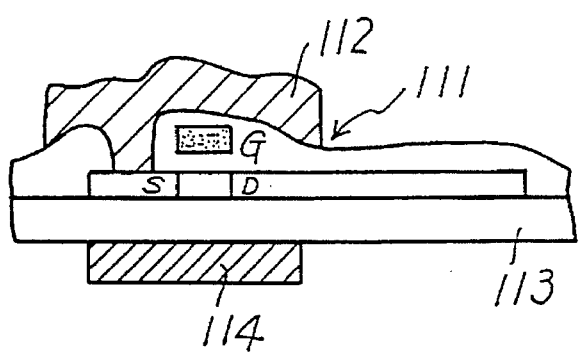
FIG. 9 is a schematic diagram showing a still further light shielding structure of a TFT.

FIG. 9 is a schematic sectional diagram showing a fourth example of the light shielding structure. This example is a combination of the light shielding constructions shown in FIGS. 6 and 8. Namely, a TFT 111 is shielded from top and back thereby almost perfectly suppressing a photo-leak current. An upper light shielding film is composed of a part of a metal lead 112, and a lower light shielding film is composed of a pattern film 114 formed on a back face of an underlying insulative film 113 in registration with the TFT 111.

Figure 10:
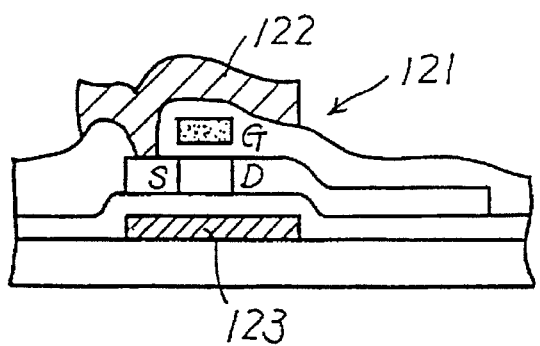
FIG. 10 is a schematic diagram showing a still further light shielding structure of a TFT.
Figure 11A:
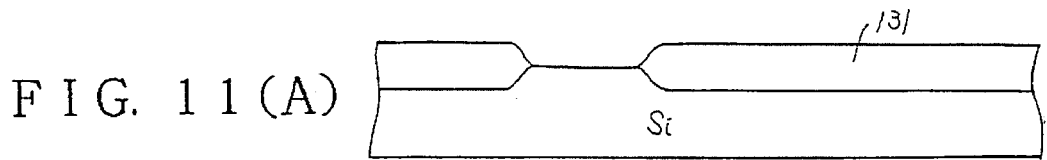
FIGS. 11(A) to 11(G) are step diagrams showing IC process involved in the inventive production method of the semiconductor device for a light valve.
Figure 11B:
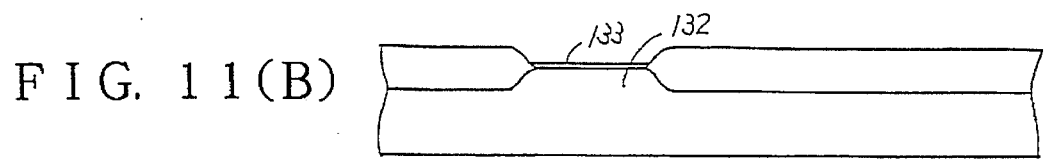
Figure 11C:
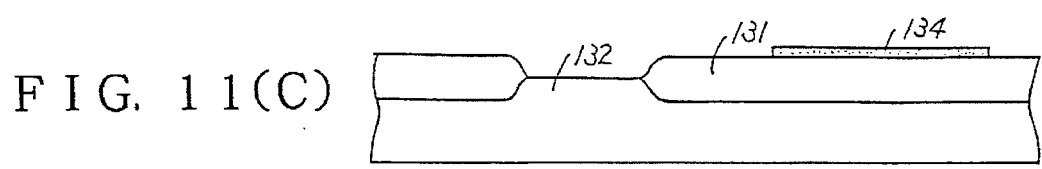
Figure 11D:
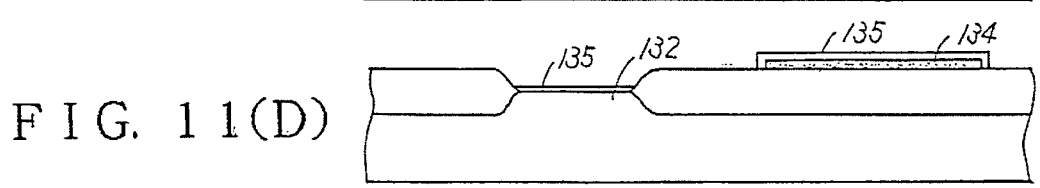
Figure 11E:
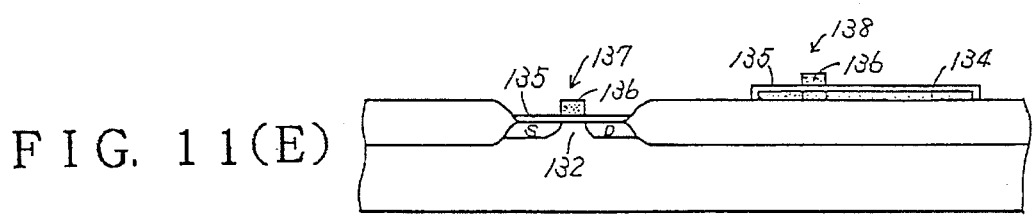
Figure 11F:
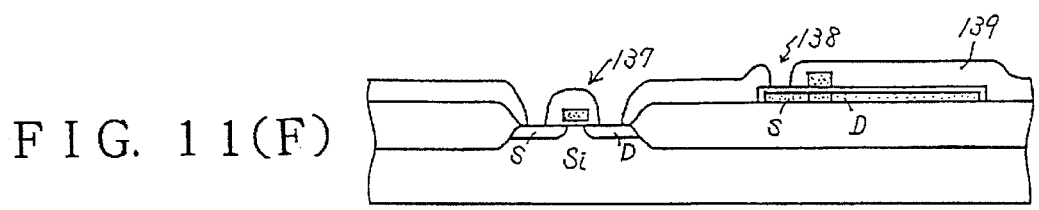
Figure 11G:
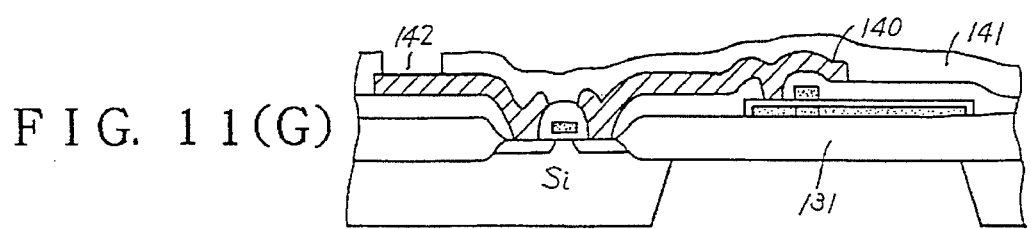
Figure 12A:
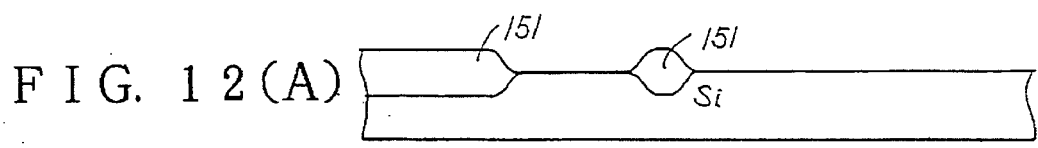
FIGS. 12(A) to 12(G) are step diagrams showing a second example of the IC process.
Figure 12B:
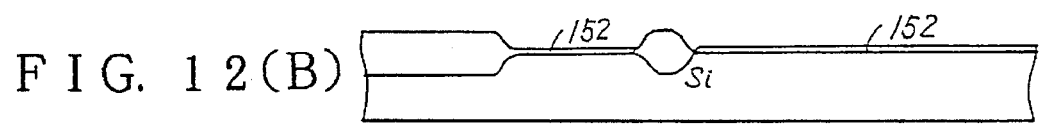
Figure 12C:
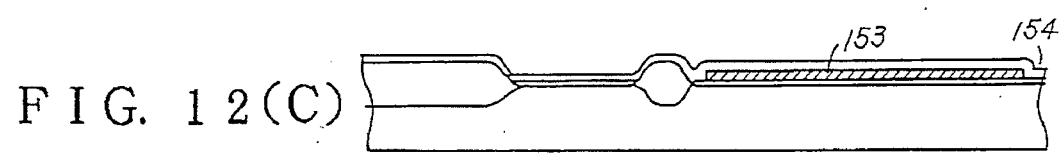
Figure 12D:
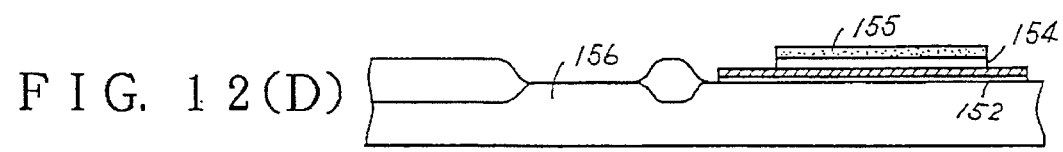
Figure 12E:
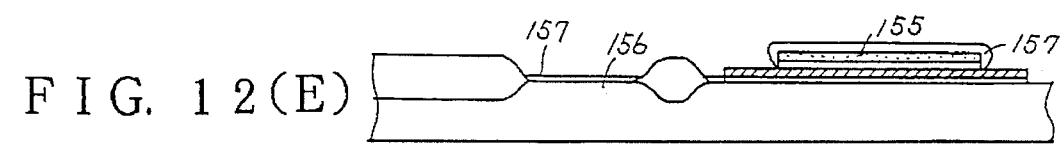
Figure 12F:
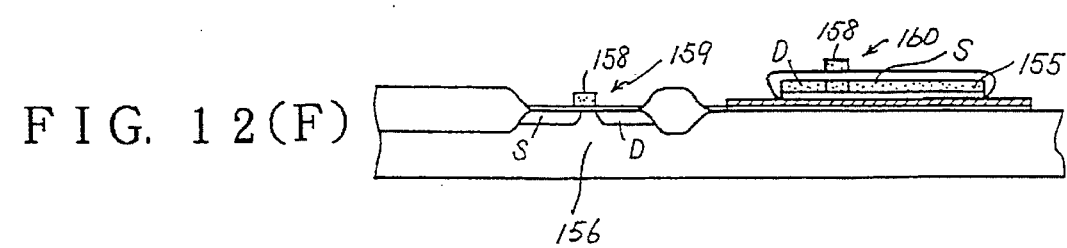
Figure 12G:
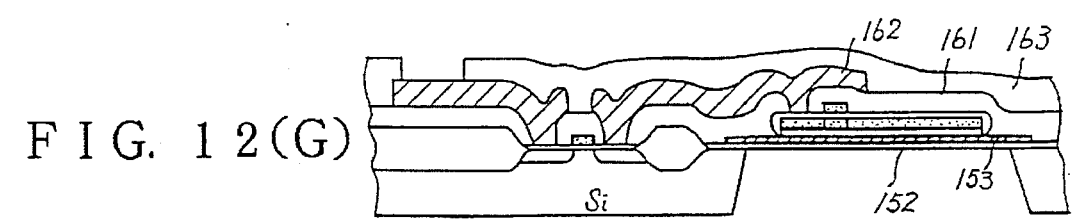
Figure 13A:
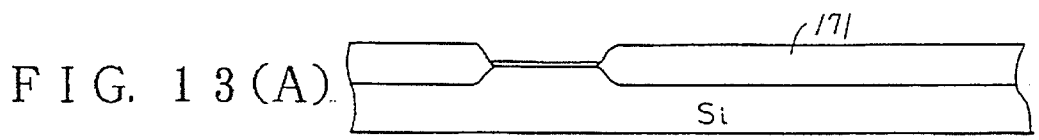
FIGS. 13(A) to 13(G) are step diagrams showing a third example of the IC process.
Figure 13B:
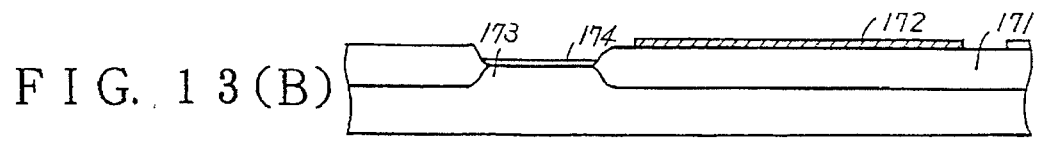
Figure 13C:
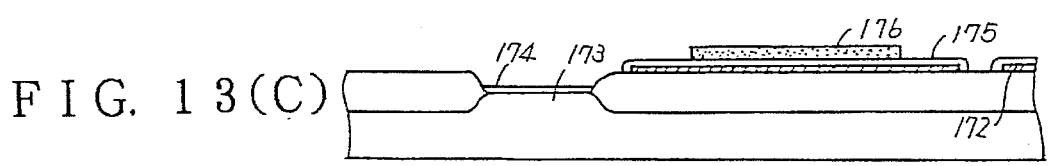
Figure 13D:
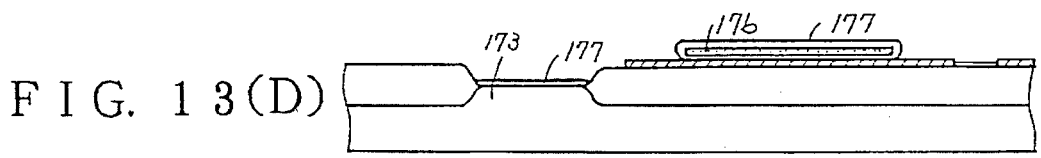
Figure 13E:
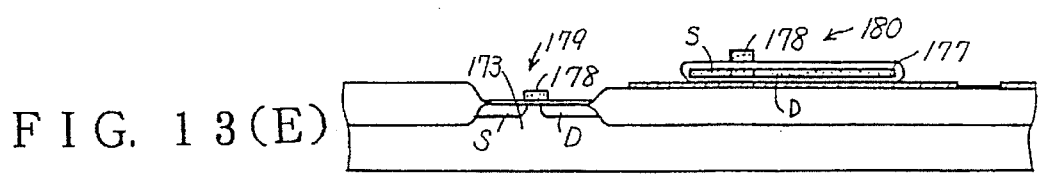
Figure 13F:
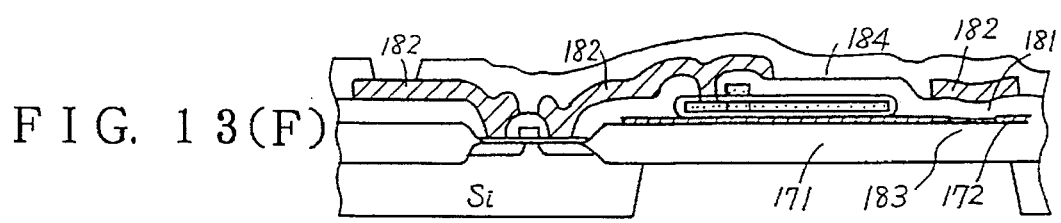
Figure 13G:
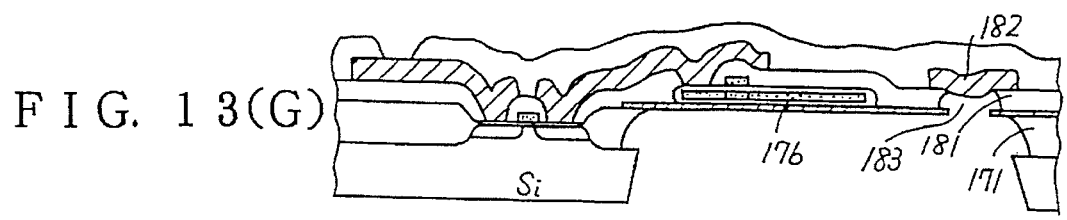
Figure 14A:
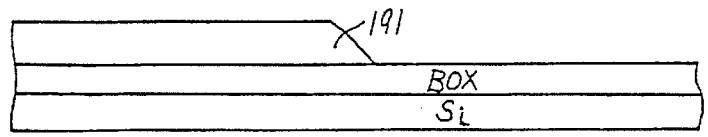
FIGS. 14(A) to 14(F) are step diagrams showing a fourth example of the IC process.
Figure 14B:
Figure 14C:
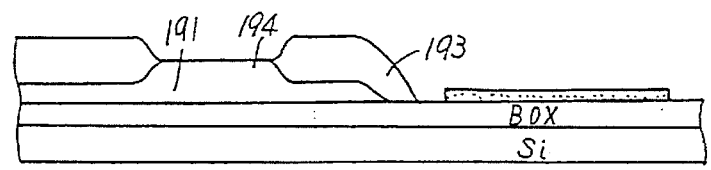
Figure 14D:
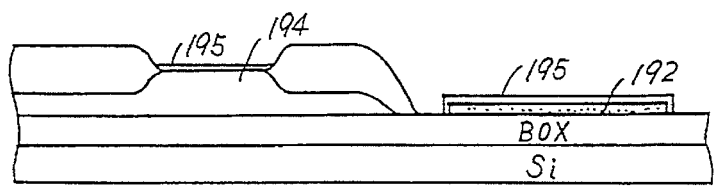
Figure 14E:
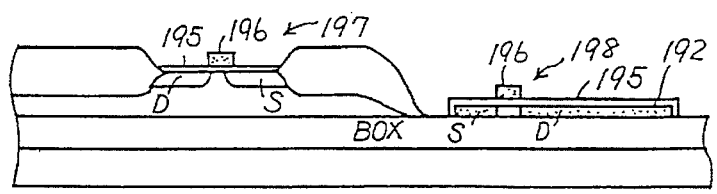
Figure 14F:
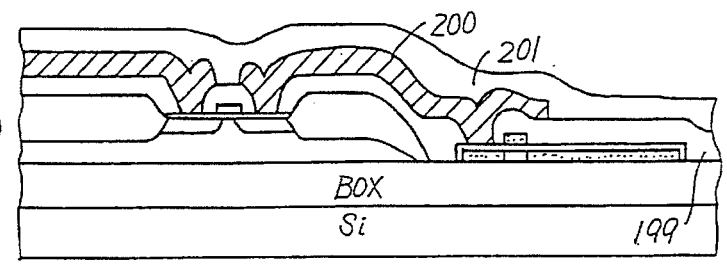

FIG. 10 is a schematic sectional diagram showing a fifth example of the light shielding structure. This example is a combination of the light shielding structures shown in FIGS. 7 and 8 such that a TFT 121 is almost completely shielded from upper and lower sides. An upper light shielding film is composed of a part of a metal lead 122, while a lower light shielding film is composed of an electrically conductive pattern film 123 which functions also as a back gate electrode.

Next, the description is given for the production method of the semiconductor device for a light valve according to the invention. FIG. 11 shows a case of using polysilicon TFT as a switching element in the pixel array. The production method is generally divided into two steps. In the preceding step, an IC process is applied to a semiconductor substrate to form a pixel array and a drive circuit. In the succeeding step, the semiconductor substrate is selectively etched to effect transparent treatment. Hereinafter, examples of the IC process will be described with reference to FIGS. 11–17. Further, examples of the etching process or transparent process will be described with reference to FIGS. 18–25. Hereafter described various preceding steps and succeeding steps can be coupled in different manners and may be selected according to structure, material and usage of the semiconductor device for a light valve.

Initially referring to FIG. 11, a first example of the IC process will be explained. This example utilizes a bulk of a single crystal silicon (monosilicon) substrate. In step A, a filed oxide film 131 is formed on a surface of a silicon substrate Si for device isolation. Concurrently, an impurity is doped into a well to provide a device region, or field doping is also carried out. Further, a resist mask composed of a silicon nitride or the like is provisionally formed on a back face of the silicon substrate S. Next in step B, a thin oxide film 133 is formed on a surface of the device region 132. Then, in step C, a polysilicon thin film 134 is formed on a surface of the field oxide film 131 in a given pattern, and thereafter the thin oxide film 133 is removed to make clean the device region 132. In a later step, a TFT is formed for pixel switching in the polysilicon thin film 134. Further, the field oxide film 131 just under the polysilicon thin film 134 will serve as an etching stopper in a later step. Then in step D, a gate insulating film 135 is concurrently formed on both of the device region 132 and the polysilicon thin film 134. Concurrently, channel doping is carried out. In step E, individual gate electrodes are formed in a given pattern over the device region 132 and the polysilicon thin film 134 through the gate insulating film 135. Further an impurity is introduced by ion implantation in self-alignment manner using each gate electrode 136 as a mask to thereby form a source region S and drain region D.

In such a manner, this example is advantageous in that the substrate is concurrently formed with a silicon transistor 137 which constitutes a drive circuit element and a polysilicon TFT 138 which constitutes a pixel switching element. As an additional merit, a pixel element can be formed of the same polysilicon thin film concurrently with the TFT 138. Subsequently in step F, an intermediate insulating film 134 composed of PSG or the like is entirely deposited over the silicon substrate Si. Then, contact holes are formed through the intermediate insulating film 139 in communication with source and drain regions of the silicon transistor 137 and with a source region of the TFT 138. Lastly in step G, a metal lead film 140 is formed on the intermediate insulating film 134 in a given pattern. Then, a passivation film 141 is coated. At this stage, the passivation film 141 is patterned such as to expose a pad electrode 142 for external connection. Thereafter, after bonding adhesively the transparent support substrate (not shown), processing advances to the succeeding steps for the etching process. As described before, the field oxide film 131 over which the pixel array including the TFT 138 is formed, serves as an etching stopper. The field oxide film 131 has a thickness normally in the range of 0.5–1.0 μm.

FIG. 12 is a schematic step diagram showing a second example of the IC process. A pixel array will be formed on a right half portion of the figure, and a drive circuit will be formed on a left half portion of the same figure. First, in step A, a field oxide film 151 is formed on a surface of a bulk single crystal silicon substrate Si. Basically, the step is similar to step A of the first example shown in FIG. 11; however, this step is different in that a field oxide film is not formed in a portion where a pixel array is to be formed. Then in step B, a thin oxide film 152 is formed on an exposed surface of the silicon substrate Si. Subsequently in step C, a silicon nitride film 153 is formed on the right half portion. Further, a silicon oxide film 154 is formed entirely over the silicon substrate Si. This silicon oxide film 154 is provided to ensure a junction stability relative to a later-formed TFT as well as to improve adhesion. In step D, a polysilicon thin film 155 is formed in a given pattern over the silicon oxide film 154. Subsequently the previously formed thin oxide film 152 is removed from the device region 156. In step E, a gate oxide film 157 is formed over both of the device region 156 and the polysilicon thin film 155. Subsequently in step F, respective gate electrodes 158 are formed. Then, an impurity is doped by ion implantation to form a source region S and drain region D.

By such manner, a regular silicon transistor 159 is formed in the device region 156, and a TFT 160 and a pixel electrode are formed in the polysilicon thin film 155. In manner similar to the FIG. 11 case, the present method features that both of the drive circuit portion and the pixel array portion can be subjected concurrently to various treatments such as gate oxide film forming process of a transistor, channel doping process, gate electrode forming process, and impurity doping process of source/drain regions. Lastly, in step G, a surface of the silicon substrate Si is coated with an intermediate insulating film 161. Thereafter, a metal lead 162 is formed in a given pattern. Further, a passivation film 163 is coated. Thereafter, after bonding adhesively the transparent support substrate, processing is switched to the back face of the substrate to make the silicon substrate Si transparent. In this case, an etching stopper is provided in the form of a composite film composed of the previously formed oxide film 152 and nitride film 153. In contrast to the field oxide film shown in FIG. 11, this composite film is significantly thinner, thereby improving driving efficiency in the case that a liquid crystal cell or the like is assembled on the back face of the substrate.

FIG. 13 is a step diagram showing a third example of the IC process. First in step A, a field oxide film 171 is formed over a bulk single crystal silicon substrate for device isolation. In manner similar to the first example shown in FIG. 11, the field oxide film 171 is provided entirely to cover a portion where a pixel array is to be formed in this example. In step B, an underlying silicon nitride film 171 is formed in a given pattern over the field oxide film 171 within the portion assigned to a pixel array. At this stage, the nitride film 172 is partly removed for electrode connection in advance. Further, a thin oxide film 174 is formed on a surface of each device region 173 within another portion where a drive circuit is to be formed. In step C, a silicon oxide film 175 is grown over the nitride film 172. A polysilicon thin film 176 is formed in a given pattern over the film 175. By interposing the oxide film 175, the junction condition to the polysilicon thin film 176 can be improved as well as adhesion characteristic can be also improved. Further, the thin oxide film 174 left on the device region 173 is removed. In step D, a gate oxide film 177 is formed concurrently on both of the polysilicon thin film 176 and the device region 173. Further, channel doping is also carried out concurrently for both the portions. In step E, gate electrodes 178 are formed concurrently in both the portions, and then ion implantation is conducted using the gate electrode as a mask to form concurrently a source region S and a drain region D.

By such a manner, a transistor 179 is formed in the device region 173 for construction of a driver circuit, and a TFT 180 is formed in the polysilicon thin film 177 for pixel driving. Next in step F, an intermediate insulating film 181 is deposited over the silicon substrate Si. A patterned metal lead film 182 is formed thereover such as to achieve electrical connection among the transistor elements through contact holes provided in the intermediate insulating film 181. At this stage, another metal lead 182 is formed in registration to the section 183 from which the nitride film 172 has been provisionally removed to thereby provide a pad for electrical connection to a counter electrode. Further, a passivation film 184 is coated entirely to protect the semiconductor device. However, the metal lead film 182 is locally uncoated such as to expose a section assigned to pad electrode. Thereafter, after bonding the transparent support substrate on to the surface side of the substrate, processing is switched to a back face of the substrate to etch away a bulk of the silicon substrate Si to make the pixel array portion transparent. For example, KOH solution is utilized as an etchant and the field oxide film 171 serves as an etching stopper. Lastly in step G, an etchant is switched to hydrofluoric acid solution to etch away the field oxide film 171 and the intermediate insulating film 181. At this stage, the intermediate insulating film 181 composed of PSG or the like is etched away by self alignment through the open section 183 free of the nitride film 172 so that the metal lead 182 is exposed to the back face for connection to a counter electrode. A liquid crystal cell may be assembled into a display window portion from which the bulk of the silicon substrate is removed. In such a case, a counter electrode formed on a counter substrate is electrically connected to the exposed metal lead 182. In this embodiment, the field oxide film 171 is removed from the transparent portion, hence a pixel electrode composed of the polysilicon thin film 176 can be closely disposed to a liquid crystal layer filled in the liquid crystal cell.

FIG. 14 is a schematic step diagram showing a fourth example of the IC process. A drive circuit will be formed in a left half portion of the figure, and a pixel array will be formed in a right half portion of the same figure. In this example, an SOI substrate is utilized in place of the semiconductor substrate composed of a bulk single crystal silicon. The SOI substrate is constructed such that a monosilicon layer is laminated on a monosilicon wafer through a buried insulating film BOX. In contrast to a conventional composite substrate in which a quartz glass wafer and a monosilicon wafer are laminated with each other, the SOI substrate is composed of the same silicon material for the upper and lower layers interposed with the insulating film. Consequently, there is no substantial difference in thermal expansion coefficients to thereby withstand against high temperature process. First, in step A, a monosilicon layer 191 provided on the insulating film BOX is partly etched to expose the insulating film BOX within a portion where the pixel array is to be formed. A well is formed in the monosilicon layer 191 which is left within another portion where the drive circuit is to be formed. In step B, a patterned polysilicon thin film 192 is formed over the exposed insulating film BOX. Subsequently in step C, LOCOS process is applied to the monosilicon layer 191 to form a field oxide film 193 for device isolation in step D, a gate oxide film 195 is formed over both of the device region 194 and the polysilicon thin film 192. Further, channel doping is conducted to regulate a threshold level. Subsequently in step E, a patterned gate electrode 196 composed of a polysilicon or the like is concurrently formed on both of the device region 194 and the polysilicon thin film 192 the gate oxide insulating film 195. Further, ion implantation is conducted in self alignment manner using the gate electrode 196 as a mask so as to dope a desired impurity to thereby form a source region S and a drain region D.

By such a manner, a transistor 197 is formed in the device region 194 involved in a drive circuit, while a TFT 198 for pixel switching is formed in the polysilicon thin film 192. Further, an extended section of the drain region D of the pixel switching. TFT 198 constitutes a pixel electrode. Lastly in step F, the insulating film BOX formed thereon with the transistor elements is covered by an intermediate insulating film 199. A metal lead film 200 is formed over the film 199. Further, a passivation film 201 is deposited on the film 200. Thereafter after bonding adhesively the transparent support substrate onto the surface side of the substrate SOI, processing is switched to a back face of the substrate. The present example utilizes, as described before, the SOI substrate in which the silicon single crystal wafer Si is laminated on a back face of the underlying insulating film BOX. In this example, this silicon wafer is removed to make the pixel array portion transparent. Further, the switching TFT may be made of single crystal silicon without processing the steps A and B (not shown in the figure). Furthermore, a part of the single crystal silicon, which is disposed on a back face of the underlying insulating film BOX under a portion the pixel array, may be removed.

Figure 15:
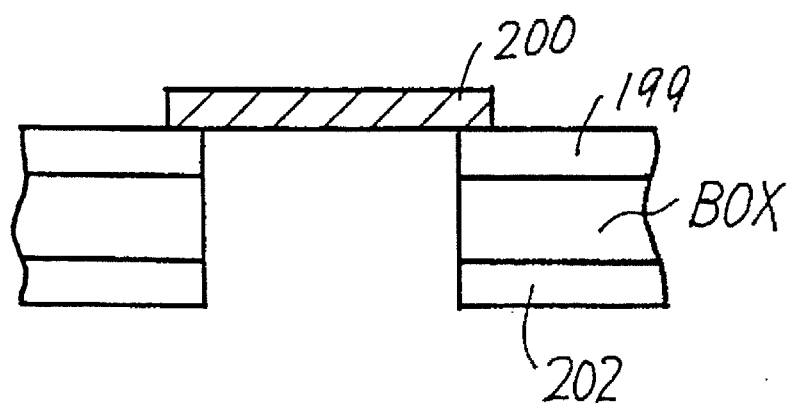
FIG. 15 is an illustrative diagram showing a step of forming a pad to a counter electrode.

FIG. 15 shows a variation of the FIG. 14 structure, where a metal lead for connection to a counter electrode is provided on a top face of the SOI substrate. As shown in the figure, the metal lead is patterned over the intermediate insulating film 199 and the insulating film BOX is positioned under them. A resist 202 is patterned on the back face of the insulating film BOX such as to surround the metal lead 200. The insulating film BOX composed of silicon oxide material and the intermediate insulating film 199 composed of PSG or the like are selectively etched away through the patterned resist using an etchant composed of hydrofluoric acid or the like, to thereby expose a back of the metal lead 200. In a later step, this exposed metal lead 200 will be electrically connected to a counter electrode which is formed on an internal surface of a counter substrate of a liquid crystal cell.

FIG. 16 is a schematic step diagram showing a fifth example of the IC process. In manner similar to the FIG. 14 case, the SOI substrate is utilized to constitute a semiconductor device for a light valve. A pixel array will be formed on a right half portion of the figure, and a drive circuit will be formed on a left half portion of the same figure. First in step A, a monosilicon layer Si on an insulating film BOX is subjected to doping for forming a well, and to field doping. Thereat LOCOS process is applied to form a field oxide film 211. The field oxide film 211 entirely covers a portion where a pixel array is to be formed, while individually isolated device regions 212 are provided in another portion where a drive circuit is to be formed. Further, a thin oxide film 214 is formed over the device region 212. In step B, a patterned polysilicon thin film 213 is formed on the field oxide film 211. In addition, the thin oxide film 214 is removed from the device region 212. In step C, a silicon transistor 215 of the drive circuit and a TFT 216 for pixel switching are concurrently formed in manner similar to the previous examples. Further, the polysilicon thin film 213 is partly extended to form a pixel electrode. In step D, the silicon transistor 215 and the TFT 216 are covered by an intermediate insulating film 217. Thereafter, a patterned metal lead 218 is formed over the film 217. Further, though not shown in the figure, a passivation film is coated over the metal lead 218. Thereafter, after bonding the transparent support substrate onto the surface side of the substrate SOI, the processing is switched to a back face of the substrate such that a back silicon wafer is entirely removed using the underlying insulating film BOX of the SOI substrate as an etching stopper. The etchant may be composed of an alkali KOH solution. At this stage, a pattern of the top face can be viewed from the back face through the transparent insulating film BOX. Consequently, a patterned resist 219 can be formed directly on the back face of the BOX to selectively cover the drive circuit portion without using a two-face aligner. The insulating film BOX and the monosilicon layer Si are further etched away through the resist 219 to thereby expose a back face of the field oxide film 211 positioned on the pixel array portion.

Figure 16A:
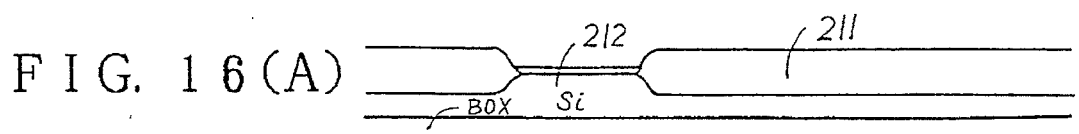
FIGS. 16(A) to 16(D) are step diagrams showing a fifth example of the IC process.
Figure 16B:
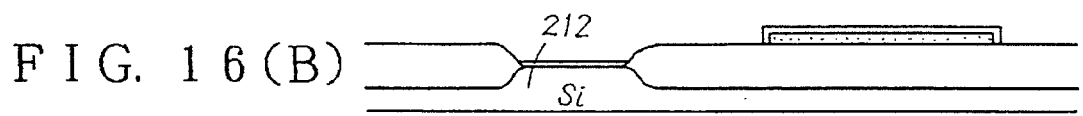
Figure 16C:
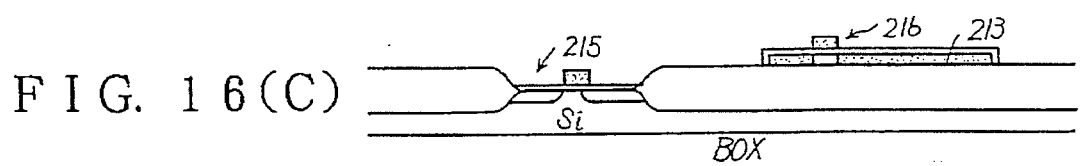
Figure 16D:
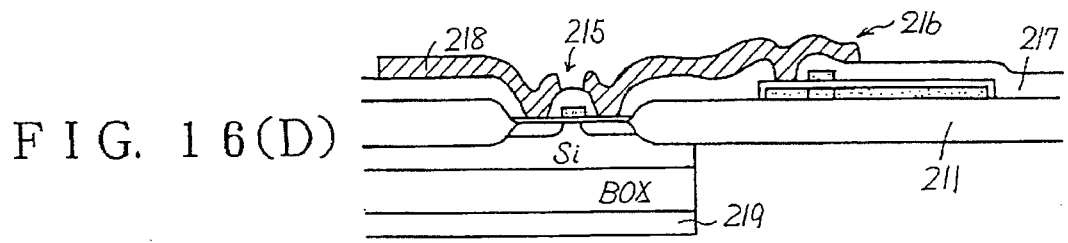
Figure 17:
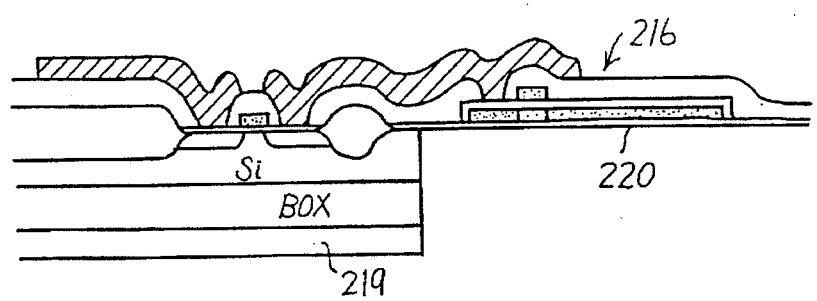
FIG. 17 is a step diagram showing a sixth example of the IC process.

FIG. 17 shows a variation of the FIG. 16(D) structure in further thinned form. This variation has basically the same construction; however, a pixel array portion is not provided on a field oxide film, but is provided on a thin oxide film 220. In such a structure, a monosilicon layer Si of the SOI substrate is etched away using the thin oxide film 220 as an etching stopper so that the monosilicon layer Si is selectively removed from the pixel array portion. In this variation, a distance between a pixel electrode and a liquid crystal layer (not shown) is further reduced to more efficiently transmit a drive voltage to thereby improve an image display quality, as compared to FIG. 16 structure.

Figure 18A:
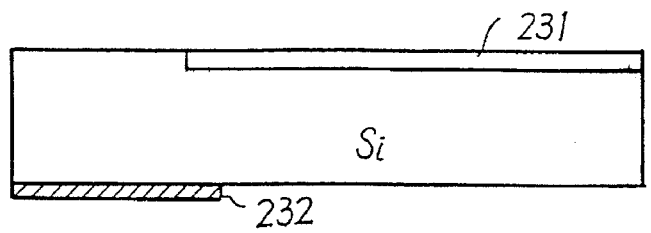
FIGS. 18(A) and 18(B) are step diagrams showing a first example of etching process from a back face, involved in the inventive production method of the semiconductor device for a light valve.
Figure 18B:
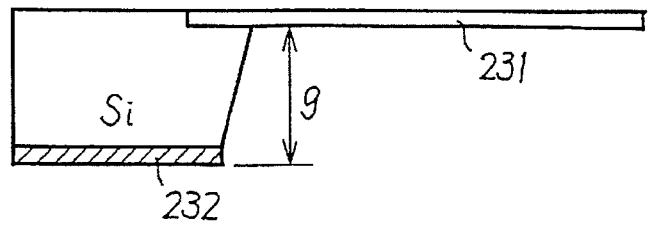

Next, the detailed description will be given for the etching process of the back face in conjunction with FIGS. 18–25. The transparent support substrate disposed at the surface side and the adhesive layer are omitted from FIGS. 18 to 25. FIG. 18 is the first example of the etching process in which a bulk monosilicon substrate is etched from a back face. Firstly in step A of the preceding IC process, a stopper film 231 is provisionally formed on a top face of a silicon single crystal substrate Si. The stopper film 231 may be composed of a silicon oxide film a silicon nitride film or a composite film thereof. Though not shown in the figure, a pixel array is formed on the stopper film 231. On the other hand, a drive circuit is formed on another portion outside the stopper film 231. In the IC process, a patterned film 232 is provisionally formed on the back face of the monosilicon substrate Si. The film 232 may be composed of a silicon nitride film, and may be patterned by means of a two-face aligner. Subsequently in step B, after bonding adhesively the transparent support substrate onto the surface side of the single crystal Si substrate (not shown in FIGS.), the monosilicon substrate Si is etched away through a mask of the film 232 to make the pixel array portion transparent.

The monosilicon substrate Si is etched by a KOH solution to reach the stopper film 231. This example utilizes the two-face aligner which rather complicates the preceding IC process. Further, the film 232 composed of a silicon nitride film is rather easily damaged by scratches or the like. In addition, the monosilicon substrate Si normally has a bulk thickness in the order of 500–600 μm, thereby disadvantageously generating a great step or gap g. Such a steep step would hinder assembling of a liquid crystal cell in a later process.

Figure 19A:
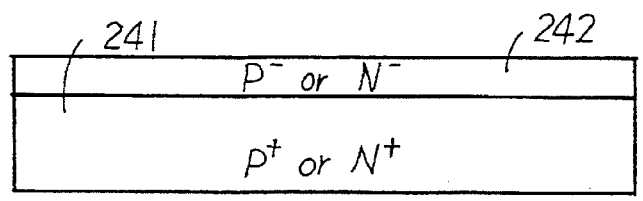
FIGS. 19(A) to 19(C) are step diagrams showing a second example of the etching process.
Figure 19B:
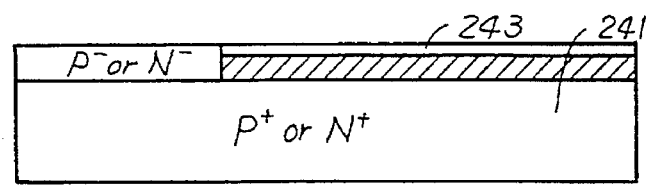
Figure 19C:
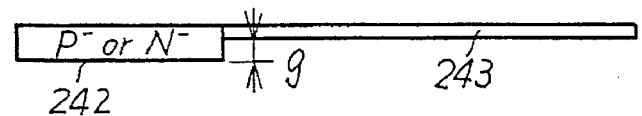

FIG. 19 is a schematic step diagram showing a second example of the etching process. In this example, as shown by step A, an epitaxial silicon substrate is adopted. An epitaxial layer 242 is provided on a silicon substrate 241 and the epitaxial layer 242 has an impurity density set lower than that of the silicon substrate 241. For example, the silicon substrate 241 has an impurity density more than $1 \times 10^{18}$ $cm^{-3}$, while the epitaxial layer 242 has an impurity density less than $1 \times 10^{18}$ $cm^{-3}$. Next, in step B of the IC process, an impurity is selectively doped into a pixel array portion at a high density to turn the epitaxial layer into $P^+$ type or $N^+$ type as same as the substrate 241. Further, a stopper film 243 is formed thereover. Then, though not shown in the figure, a pixel array and a drive circuit are concurrently formed by an IC process. Thereafter being bonded adhesively to the transparent support substrate onto a surface of the silicon substrate (not shown in the FIGS.), in the next step C, an etching process of a back face is conducted. This example utilizes an etchant composed of a mixture of hydrofluoric acid, nitric acid and acetic acid to effect selective etching based on the impurity density difference. Namely, the above etchant substantially does not etch a low density impurity region, while the same etchant selectively etches a high density impurity region. Accordingly in step C, the silicon substrate 241 of the $P^+$ or $N^+$ type is first entirely removed, and then the high density epitaxial layer is likewise etched just under the stopper film 243. On the other hand, the $P^-$ or $N^-$ type epitaxial layer 242 formed with the drive circuit is left as it is without being etched. Alternatively, the silicon substrate 241 may not be subjected to a whole etching process, but the silicon substrate may be ground until an intermediate stage to thereby achieve quick processing. As described above, the present example utilizes the selective etching based on difference in etching rate due to the impurity density difference, thereby realizing the transparent pixel array without using the two-face aligner. Further, only the low density epitaxial layer 242 is left in the last stage, thereby reducing the gap g.

Figure 20A:
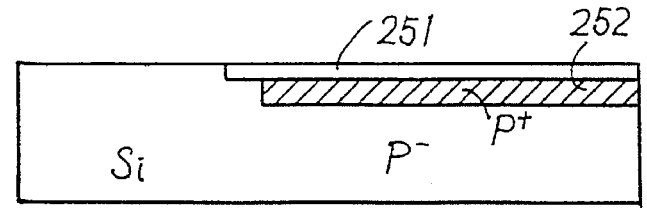
FIGS. 20(A) and 20(B) are step diagrams showing a third example of the etching process.
Figure 20B:
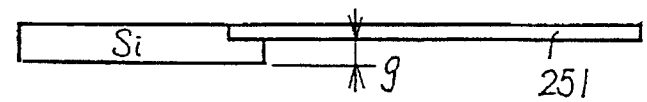

FIG. 20 is a schematic step diagram showing a third example of the etching process. As described above, the FIG. 19 method well utilizes the epitaxial substrate to remove a bulk thickness of the back face by the selective etching without using the two-face aligner. However, the epitaxial substrate is disadvantageously more expensive than a regular bulk monosilicon substrate. In view of this, the present example applies the selective etching technology to the bulk monosilicon substrate. First in step A of the IC process, a stopper film 251 is formed on a pixel array area. Further, a P type impurity is doped under the stopper film 251 within its border at a high density. Such a doping can be effected by ion implantation effective to adjust a depth of a high density impurity region 252 by regulating the acceleration energy. In this example, the region 252 has a depth in the order of 10 μm. Thereafter bonding adhesively the transparent support substrate onto a surface side of the single crystal silicon substrate (not shown in the FIGS.), in next step B, the monosilicon substrate Si is ground from a back face to reduce its thickness up to 10 μm. Next, the high density impurity region 252 is selectively etched away by using a solution mixture containing hydrofluoric acid, nitric acid and acetic acid at the ratio of 1:3:8. By such a manner, the pixel array can be made transparent without using the two-face aligner. Further, the gap g can be reduced up to 10 μm.

FIG. 21 is a schematic step diagram showing a fourth example of the etching process. This example also adopts the selective etching technology. However, the etchant is composed of an alkali KOH solution in place of a solution mixture of hydrofluoric acid, nitric acid and acetic acid. The KOH solution is blocked from etching reaction by a silicon oxide film and a silicon nitride film. In addition, the etching reaction of the KOH solution is stopped by a B type high density impurity layer. First, in step A of the IC process, a stopper film 262 is provisionally formed over a silicon single crystal substrate 261 to cover a pixel array area. Though not shown in the figure, a pixel switching TFT and other elements are formed on the stopper film 262 by the IC process. On the other hand, a silicon layer 263 is reserved on a drive circuit area in which transistor elements are integrally formed by the same IC process. In this example, a P type high density impurity payer 264 is buried just under the monosilicon layer 263. This burying process is conducted by ion implantation while adjusting the acceleration energy. Thereafter bonding adhesively the transparent support substrate onto a surface side the single crystal silicon substrate (not shown in the FIGS.), in the next step B, the silicon substrate 261 is removed and made transparent by using an etchant composed of KOH solution. As described before, the P type high density impurity layer 264 is hardly etched by the KOH solution, and is therefore left as it is. The left high density impurity layer 264 has a thickness in the order of several μm to thereby significantly reduce the gap g.

FIG. 22 is a schematic step diagram showing a fifth example of the etching process. In step A of the IC process, a stopper film 272 is formed on a top face of a monosilicon substrate 271. Though not shown in the figure, thereafter a drive circuit and a pixel array are formed integrally by the IC process. Thereafter bonding adhesively the transparent support substrate onto a surface side the single crystal silicon substrate (not shown in the FIGS.), in next step B is undertaken to carry out back face processing. First, a silicon substrate 271 is thinned to a given thickness in the order of, for example, 2 μm by back face grinding such that pattern on the top face can be viewed from the back face. Consequently, a patterned resist 273 is formed on the ground back face of the silicon substrate 271 to selectively cover the drive circuit portion without using a two-face aligner. In this example, the resist film 273 is composed of a photo-sensitive fluorocarbon resin which has a good chemical resistance to the KOH solution. Subsequently in step C, the KOH solution is applied to remove a bulk thickness of the ground silicon substrate under the stopper film 272. In this example, the gap g can be further reduced to the order of 2 μm.

FIG. 23 is a schematic step diagram showing a sixth example of the etching process. In step A, a bulk thickness of a monosilicon substrate 281 is removed by a KOH solution to make transparent a portion under a stopper film 282 in a manner similar to step B of the FIG. 18 method. As described before, at this stage, the left silicon substrate 281 has a thickness in the order of 500 μm so that the gap g is still great, which would hinder assembling of a liquid crystal cell. In view of this, for thinning the left bulk thickness, a back face of the silicon substrate entirely coated by a protective film 283 in step B. This protective film 283 may be composed of the silicon rubber. Next in step C, the back face of the substrate is ground so that the thickness of the silicon substrate 281 is reduced in the order of 20 μm. Lastly in step D, the used protective film 283 is removed.

Figure 24:
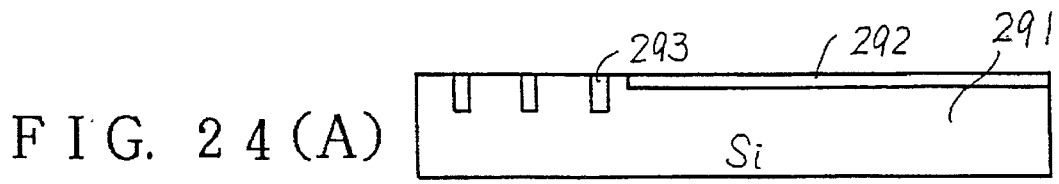
FIGS. 24(A) to 24(B) are step diagrams showing a seventh example of the etching process.
Figure 24:
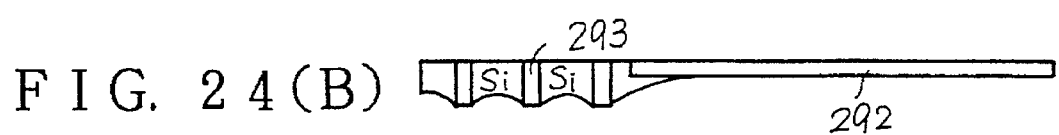

FIG. 24 is a schematic step diagram showing a seventh example of the etching process. In step A of the preceding IC process, a stopper film 292 composed of silicon oxide is provisionally formed over a top face of a single crystal silicon substrate 291 within a pixel array area. Further, a drive circuit is integrally formed, and concurrently posts 293 composed of silicon oxide are buried in the drive circuit portion. The burying depth is in the order of 5–10 μm. For example, after forming trenches, the silicon oxide is deposited to fill the trenches. Thereafter bonding adhesively the transparent support substrate onto a surface side of the single crystal silicon substrate (not shown in the FIGS.), in next step B, rough grinding is applied to a back face of the single crystal silicon substrate 291 and then mechanical chemical polishing is carried out. The mechanical chemical polishing features an extreme selection rate of 1 to 1000 or more between $SiO_2$ and Si, such that the bulk thickness of the silicon substrate can be selectively removed under the stopper film 292. Further, since the silicon oxide posts or columns 293 are buried relatively close, silicon around the posts is also left to thereby avoid ill effect to the drive circuit disposed on the top face.

Figure 25:
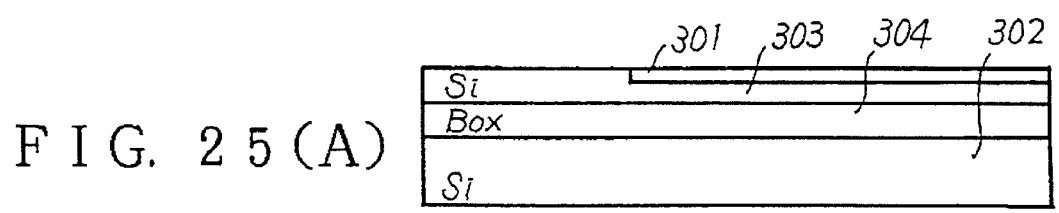
FIGS. 25(A) to 25(D) are step diagrams showing an eighth example of the etching process.
Figure 25:
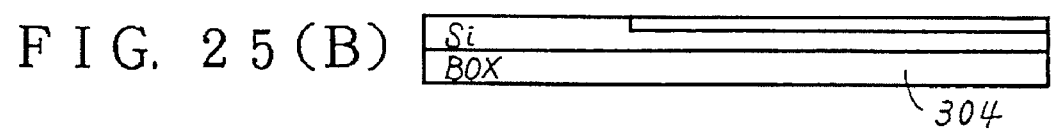
Figure 25:
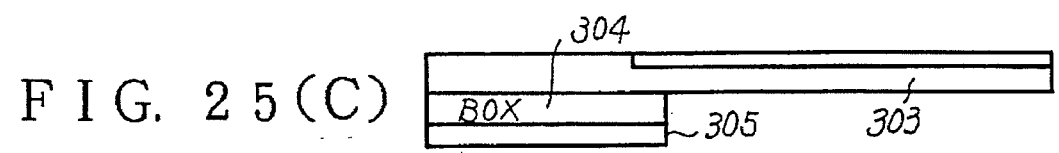
Figure 25:
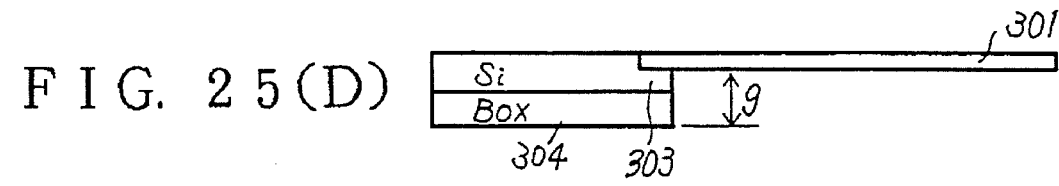
Figure 26:
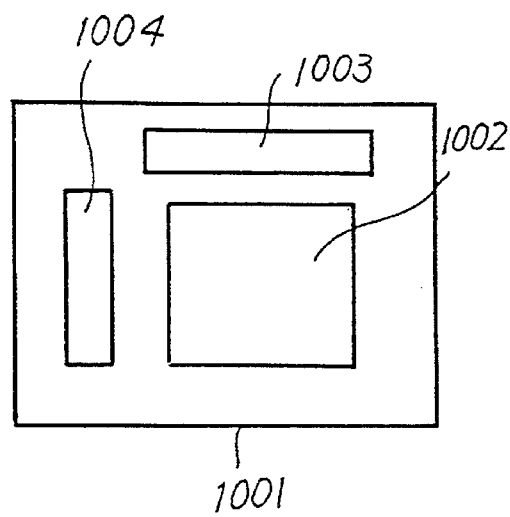
FIG. 26 is a schematic plan view showing a driving substrate of a conventional active matrix liquid crystal display device.
Figure 27:
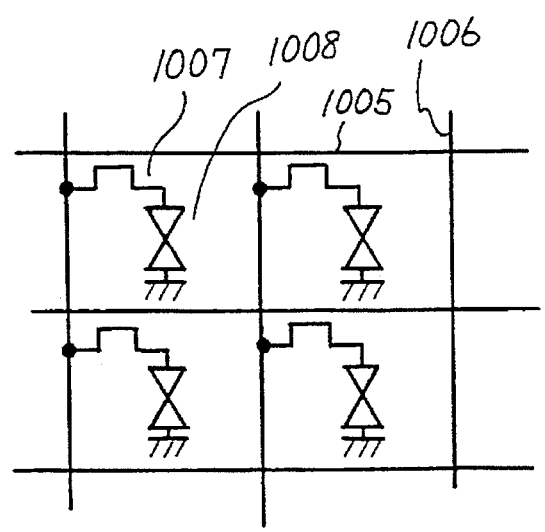
FIG. 27 is a schematic structural diagram of a pixel array formed in the conventional drive substrate.

FIG. 25 is a schematic step diagram showing an eighth example of the etching process. In this example, an SOI substrate is subjected to the etching process. First, in step A of the preceding IC process, a stopper, film 301 is formed in a top face of the SOI substrate. This SOI substrate is composed of a laminate of a back silicon wafer 302, a top monosilicon layer 303 and an intermediate insulating film 304. Though not shown in the figure, a pixel array is formed on the stopper film 301, while a drive circuit is formed in the remaining portion of the SOI substrate. Preferably, the monosilicon layer 303 has a relatively great thickness in the order of 1.5 to 2 μm or more so as to stabilize operating characteristics of the drive circuit. Moreover, this thickness of 1.5 to 2 μm may be utilized to determine a gap spacing of a liquid crystal cell. Thereafter bonding adhesively the transparent support substrate onto a surface side of the substrate SOI (not shown in the FIGS.), in next step B, the silicon wafer 302 is entirely removed using the intermediate insulating film 304 as an etching stopper. Subsequently in step C, a patterned resist 305 is formed on a back face of the intermediate insulating film (BOX) 304 in registration with the drive circuit portion. At this stage, since the silicon crystal layer 303 has a thickness in the order of 1.5–2 μm, a pattern of the top face can be viewed from the back face to thereby enable correct patterning of the resist 305 without using two-face aligner. Lastly in step D, the intermediate insulating film 304 and the monosilicon layer 303 are etched through the resist 305 to expose a portion under the stopper film 301. In this case, the gap g may be finally reduced to the order of 2 to 5±0.5 μm.

As described above, according to the invention, the semiconductor device for a light valve is comprised of a semiconductor substrate having a thick opaque portion and a thin transparent portion, a pixel array formed in the transparent portion, a drive circuit formed in the opaque portion, and a transparent support substrate laminated to a top major face of the semiconductor substrate. In such a construction, an IC fabrication process is applied to the semiconductor substrate composed of bulk monosilicon so as to concurrently form a pixel array and a drive circuit. Consequently, there is a merit that faster and higher operation of the drive circuit can be realized without increasing processes. Further, after forming the pixel array and the drive circuit in the semiconductor substrate and laminating the transparent support substrate onto a top face of the semiconductor substrate, a bulk thickness of the semiconductor substrate is removed by etching from an area just under the pixel array to thereby quite easily make the pixel array portion transparent. Further, since a portion formed with the drive circuit has a thickness or bulk of the semiconductor substrate, heat generated by the drive circuit can be absorbed immediately, so that the drive circuit operates stably.

We claim:

1. A method of producing a semiconductor device for a light valve, comprising the steps: forming a pixel array and a drive circuit on a major face of a semiconductor substrate, the forming step comprising forming an underlying stopper film on the major face of the semiconductor substrate in registration with the pixel array, and embedding at least one silicon oxide post into the major face of the semiconductor substrate over a portion outside the stopper film containing the drive circuit; laminating a transparent support substrate on the major face of the semiconductor substrate; and selectively removing a thickness of the semiconductor substrate from a back face opposite to the major face thereof over a portion which includes the pixel array, the removing step comprising etching the back face of the semiconductor substrate by chemical mechanical polishing to remove the thickness thereof to reach the stopper film.

2. A method of producing a semiconductor device as claimed in claim 1; wherein the stopper film comprises silicon oxide.

3. A method of producing a semiconductor device as claimed in claim 1; wherein the silicon oxide post is embedded into the semiconductor substrate at a depth of 5–10 μm from the major face thereof.

4. A method of producing a semiconductor device for a light valve comprising a pixel array region and a drive circuit region on a major face of a semiconductor substrate, the method comprising: forming a stopper film on the major face of the semiconductor substrate at the pixel array region; forming a pixel array over the stopper film at the pixel array region; forming a drive circuit on the drive circuit region; embedding silicon oxide posts in the major face of the semiconductor substrate at the drive circuit region; and selectively removing a thickness of the semiconductor substrate from a back face opposite to the major face thereof to reach the stopper film such that the portion of the semiconductor substrate under the pixel region is completely removed while a portion of the semiconductor substrate under the drive circuit region remains.

5. A method of producing a semiconductor device as claimed in claim 4; further comprising the step of laminating a transparent support substrate on the major face of the semiconductor substrate.

6. A method of producing a semiconductor device as claimed in claim 4; wherein the stopper film comprises silicon oxide.

7. A method of producing a semiconductor device as claimed in claim 4; wherein the silicon oxide posts are embedded into the semiconductor substrate at a depth of 5–10 μm from the major face thereof.

8. A method of producing a semiconductor device as claimed in claim 4; wherein the semiconductor substrate is selectively removed by chemical mechanical polishing.

9. A method of producing a semiconductor device as claimed in claim 8; further comprising the step of laminating a transparent support substrate on the major face of the semiconductor substrate.

10. A method of producing a semiconductor device as claimed in claim 9; wherein the stopper film comprises silicon oxide.

* * * * *